United States Patent
Liu et al.

(10) Patent No.: US 9,634,078 B2
(45) Date of Patent: Apr. 25, 2017

(54) ORGANIC DISPLAY DEVICE

(75) Inventors: Yawei Liu, Shenzhen (CN); Yi-Fan Wang, Shenzhen (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 51 days.

(21) Appl. No.: 13/703,369

(22) PCT Filed: Sep. 14, 2012

(86) PCT No.: PCT/CN2012/081412
§ 371 (c)(1),
(2), (4) Date: Dec. 11, 2012

(87) PCT Pub. No.: WO2014/040276
PCT Pub. Date: Mar. 20, 2014

(65) Prior Publication Data
US 2015/0179726 A1    Jun. 25, 2015

(30) Foreign Application Priority Data
Sep. 13, 2012 (CN) .......................... 2012 1 0338396

(51) Int. Cl.
*H01L 51/00* (2006.01)
*H01L 27/32* (2006.01)
*H01L 51/52* (2006.01)
*H01L 51/50* (2006.01)

(52) U.S. Cl.
CPC ...... *H01L 27/3276* (2013.01); *H01L 51/0089* (2013.01); *H01L 51/0096* (2013.01); *H01L 51/5056* (2013.01); *H01L 51/5072* (2013.01); *H01L 51/5096* (2013.01); *H01L 51/5253* (2013.01); *H01L 51/0077* (2013.01); *H01L 51/0078* (2013.01); *H01L 51/0091* (2013.01); *H01L 51/5012* (2013.01); *H01L 51/5016* (2013.01)

(58) Field of Classification Search
CPC ............ H01L 27/3276; H01L 51/0077; H01L 51/0078; H01L 51/5256; H01L 51/0096; H01L 51/0097
See application file for complete search history.

(56) References Cited

U.S. PATENT DOCUMENTS

| | | | |
|---|---|---|---|
| 6,872,471 B2* | 3/2005 | Epstein | H01L 51/0077 257/80 |
| 2002/0125822 A1* | 9/2002 | Graff et al. | 313/506 |
| 2004/0012329 A1* | 1/2004 | Kobayashi | 313/504 |
| 2005/0260448 A1* | 11/2005 | Lin et al. | 428/690 |

(Continued)

*Primary Examiner* — Laura Menz
*Assistant Examiner* — Candice Y Chan
(74) *Attorney, Agent, or Firm* — Mark M. Friedman

(57) ABSTRACT

The present inversion provides an organic display device comprising at least infrared display pixel, the infrared display pixel includes a transparent substrate which is deposited with a first electrode layer, an infrared organic light emitting layer and a second electrode layer thereon, and the infrared organic light emitting layer is filled with an infrared light emitting material. The present invention can allow the organic display device to carry out large area of infrared display; and the present invention uses the flexible transparent substrate, so as to conveniently use and carry the organic display device.

7 Claims, 4 Drawing Sheets

(56) References Cited

U.S. PATENT DOCUMENTS

2006/0220542 A1* 10/2006 Suh et al. .................. 313/506
2010/0117521 A1* 5/2010 Yersin .................. C09K 11/06
  313/504

* cited by examiner

ORGANIC DISPLAY DEVICE

FIELD OF THE INVENTION

The present invention relates to a technical field of organic display, and more particularly to an organic display device.

BACKGROUND OF THE INVENTION

Organic Light Emitting Diode (OLED) is used as a new generation of lighting display device, wherein organic light emitting materials are sandwiched between a transparent anode and a metal reflective cathode, and a voltage can be applied on the organic light emitting materials to emit light. Because the OLED does not need a backlight device, it can be manufactured more compact. In comparison with other types of panel display device, the electric power consumption of OLED is lower, and the OLED can work in a broader temperature range, and manufacturing cost thereof is lower, so that it can be used more widely. And, by using organic light emitting materials of different colors, the OLED can display different colors, such as provide red, green, blue light and so on.

With the growing popularity of the infrared (IR) equipment, the requirements of the infrared applications are also increasing. The infrared equipment of the prior art is generally used in the field of heating, physical therapy, night vision, communication, navigation, plant cultivation, high-temperature sterilization, infrared detection and infrared guidance and so on, and the existence form of infrared equipment includes xenon gas lamp, heated object or laser device and so on. The infrared display of the above-mentioned forms only can be used for lighting, but unable to carry out large area of infrared display.

Although the inorganic semiconductor infrared generator in the prior art can be used to carry out large area of infrared display, used inorganic semiconductor material thereof is Te—Cd—Hg based inorganic compounds which has higher cost and more complicated production process, unable to form a thin film on polycrystalline Si, amorphous Si and a flexible plastic substrate, and is inconvenience for carrying by a user, so that those problems restrict the application of the inorganic infrared semiconductor material in infrared display device.

Compared to inorganic infrared semiconductor materials, the organic infrared material (such as infrared organic semiconductor materials) has advantages of low price and light weight, good solubility, easy to be processed into large area flexible display and able to be regulate the photoelectric properties through molecular tailoring and so on.

Therefore, it is one of the technical direction in the field of research to think how to apply the organic infrared materials to the organic display device which thus can achieve infrared display, reduce costs and increase operation convenience for users.

SUMMARY OF THE INVENTION

An object of the present invention is to provide an organic display device, wherein organic infrared materials are applied to the organic display device, so as to achieve infrared display, reduce costs and increase operation convenience for users.

To achieve above beneficial effects, the present invention constituting an organic display device, which includes at least one infrared display pixel, the infrared display pixel comprises a flexible transparent substrate which is deposited with a first electrode layer, an infrared organic light emitting layer and a second electrode layer thereon, and the infrared organic light emitting layer is filled with an infrared light emitting material;

wherein the transparent substrate is formed with scan lines, data lines, power lines and switch array elements, the infrared display pixel connects to the scan line, the data line and the power line through the switch array element, and the infrared display pixel is switched on or off according to signals of the scan line, the date line and the power line.

In one embodiment of the present invention, the infrared light emitting material is trivalent rare-earth ion complex, phthalocyanine-based material or porphyrin-based material.

In one embodiment of the present invention, the infrared light emitting material is organic polymer or organic ionic dye.

In one embodiment of the present invention, a first protective layer is formed between the transparent substrate and the first electrode layer.

In one embodiment of the present invention, a hole transport layer is formed between the first electrode layer and the infrared organic light emitting layer, and an electron transport layer is formed on the second electrode layer.

In one embodiment of the present invention, a hole blocking layer is formed between the electrode transport layer and the second electrode layer.

In one embodiment of the present invention, the infrared display pixel comprises a second protective layer, a protective space is formed between the second protective layer and the first protective layer, and all of the first electrode layer, the hole transport layer, the infrared organic light emitting layer, the hole blocking layer and the electrode transport layer are in the protective space.

In one embodiment of the present invention, the first protective layer comprises at least one layer polymer layer and the cutoff layer, and the polymer layer superimposed setting with the cutoff layer alternately.

Another object of the present invention is to provide an organic display device, wherein an organic infrared material is applied to the organic display device, so as to achieve infrared display, reduce costs and increase operation convenience for users.

To achieve beneficial effects of above, the present invention provides an organic display device, which comprises at least one infrared display pixel, the infrared display pixel includes a transparent substrate which is deposited with the first electrode layer, an infrared organic light emitting layer and a second electrode layer thereon, and the infrared organic light emitting layer is filled with an infrared light emitting material.

In one embodiment of the present invention, the transparent substrate is a flexible transparent substrate.

In one embodiment of the present invention, the infrared light emitting material is trivalent rare-earth ion complex, phthalocyanine-based material or porphyrin-based material.

In one embodiment of the present invention, the infrared light emitting material is organic polymer or organic ionic dye, wherein the band gap of the organic polymer is within a predetermined range.

In one embodiment of the present invention, a first protective layer is formed between the transparent substrate and the first electrode layer.

In one embodiment of the present invention, a hole transport layer is formed between the first electrode layer and the infrared organic light emitting layer, and an electron transport layer is also formed on the second electrode layer.

In one embodiment of the present invention, a hole blocking layer is formed between the first electrode layer and the second electrode layer.

In one embodiment of the present invention, the infrared display pixel comprises a second protective layer, the second protective layer and the first protective layer is formed with a protective space therebetween, all of the first electrode layer, the hole transport layer, the infrared organic light emitting layer, the hole blocking layer and the electron transport layer are in the protective space.

In one embodiment of the present invention, the first protective layer comprises at least one polymer layer and at least one cutoff layer, and the polymer layer and the cutoff layer are alternately superimposed with each other.

In one embodiment of the present invention, the transparent substrate is formed with scan lines, data lines, power lines and switch array elements, the infrared display pixel connects to the scan line, the data line and the power line through the switch array element, and the infrared display pixel is switched on or off according to signals from the scan line, the date line and the power line.

Compared with the existing technology, the present invention fills the infrared light emitting material into the organic light emitting layer of the organic display device to be used as the infrared organic light emitting layer, and uses the flexible transparent substrate to allow the organic display device to be able to carry out large area of infrared display, while production process can be simplified and manufacturing cost can be lowered. Because the present invention uses the transparent substrate, it is possible to manufacture the organic display device as a clothing and the like, which is thus easy to be used and carried, so that the function of the organic display device can be greatly expanded and the user's experience can be enhanced.

The above content of the present invention can be best understood by referring to the following detailed description of the preferred embodiments and the accompanying drawings.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, and etc., are only directions by referring to the accompanying drawings, and thus the used directional terms are used to describe and understand the present invention, but the present invention is not limited thereto.

Figure 1:
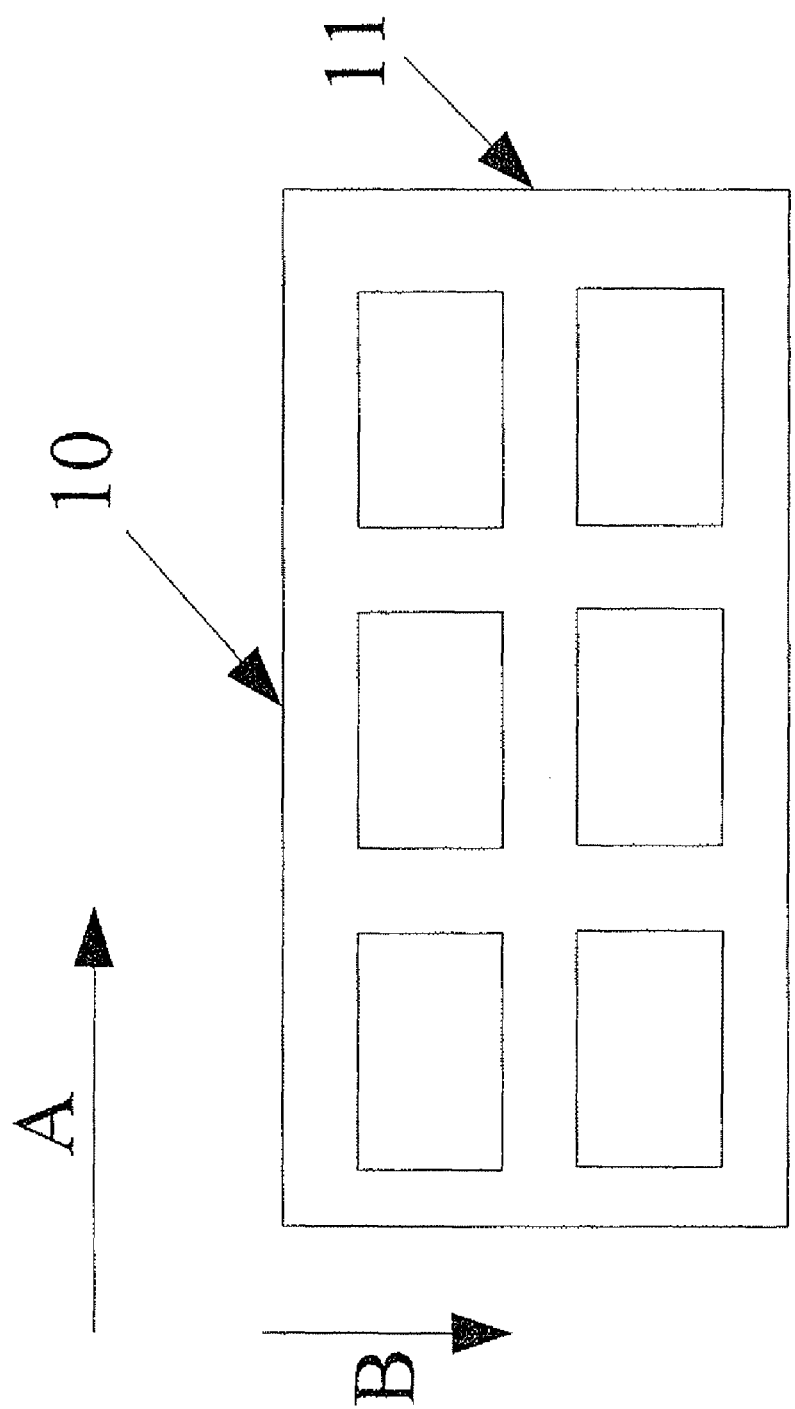
FIG. 1 is a schematic top view of a structure of an organic display device of the present invention.

Referring now to FIG. 1, FIG. 1 represents a schematic top view, wherein the organic display device 10 comprises the infrared display pixel 11 arrange through a plurality of along row direction A (is the length direction) and column direction B (is width direction), the infrared display pixel 11 is used for emitting infrared (IR) light, the wavelength of infrared light is generally between 0.76 and 400 micrometer, the light can not be seen by the naked eyes, so it needs the special instruments to observe the infrared light, but the details thereof are omitted herein.

Figure 2:
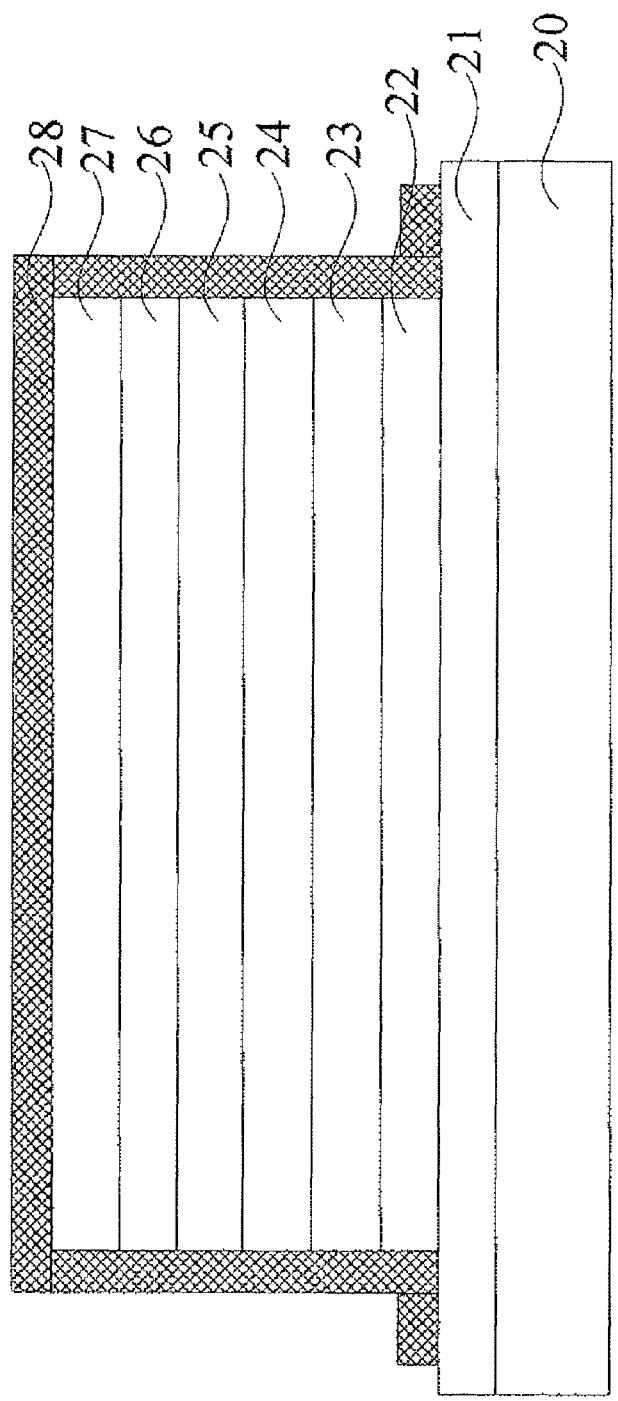
FIG. 2 is a cross-sectional schematic view of a structure of an infrared display pixel of the present invention.

Referring to FIG. 2, FIG. 2 represents a cross-sectional structure schematic view of the infrared display device 11 in FIG. 1.

The infrared display pixel 11 comprises the transparent substrate 20, the transparent substrate 20 is sequentially formed with a first protective layer 21, an electrode layer 22 (anode), a hole transport layer 23, an infrared organic light emitting layer 24, a hole blocking layer 25, an electron transport layer 26, a second electrode layer 27 and a second protective layer 28.

The second protective layer 28 has closed bent shape relative to the first protective layer 21, and is formed with a protective space with the first protective layer (not show in figure), the protective space encapsulates the first electrode layer 22, the hole transport layer 23, the infrared organic light emitting layer 24, the hole blocking layer 25, the electrode transport layer 26 and the second protective layer 27 therein to achieve the protective effect.

The infrared organic light emitting layer 24 comprises the infrared light emitting material, the infrared light emitting material is preferably selected from the trivalent rare earth ionic complex, the phthalocyanine-based material or the porphyrin-based material, or also can be organic polymer or organic ionic dye, wherein the band gap of the organic polymer (the energy difference between the lowest point of the conduction band and the highest point of the valence band) is in the predefined range, e.g. the range is ranged from 0.50 electron volts to 1.50 electron volts.

The infrared light emitting material is exemplified by copper phthalocyanine material, wherein the structure of the copper phthalocyanine is represented by the formula (I), the emission spectrum peak of the copper phthalocyanine is at 1120 nanometer (nm); the infrared light emitting material is exemplified by tris (8-hydroxyquinoline) erbium, the structure of the tris (8-hydroxyquinoline) erbium is represented by the formula (II), the emission spectra peak of tris (8-hydroxyquinoline) erbium is at 1530 nanometer.

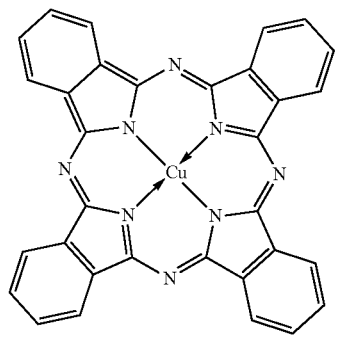

(I)

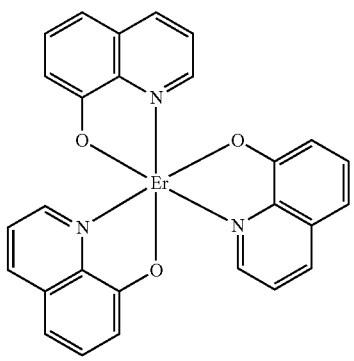
(II)

In the present invention, the transparent substrate 20 is preferably selected from a flexible transparent substrate, such as polyethylene terephthalate, PET or stainless steel foil.

Figure 3:
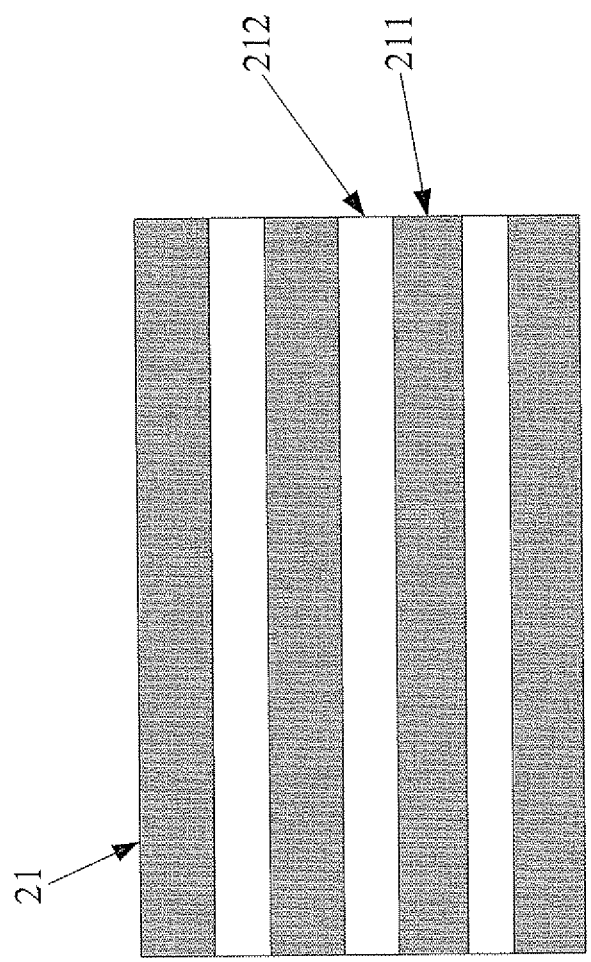
FIG. 3 is a cross-sectional schematic view of a structure of a first protective layer of the present invention.

Referring to FIG. 3, FIG. 3 represents a cross-sectional structure schematic view of the first protective layer 21 in FIG. 1.

Because the transparent substrate 20 is preferably selected from the flexible transparent substrate, the first protective layer 21 is formed to prevent the other substance from entering the infrared display pixel 11, such as can be waterproof. The first protective layer 21 includes at least one layer of polymer layer 211 and the cutoff layer 212, such as compact inorganic cutoff layer. The polymer layer 211 and the cutoff layer 212 are alternately superimposed with each other.

The materials of the polymer layer 211 can be polyxylenes, polyolefins, polyesters, or polyimide (PI) and so on. For example, the type of polyparaxylene is PPX (polyparaxylene) or PCPX (poly-chlorine xylene); the class of polylefin is PE (polyethylene), PS (polystyrene), PP (polypropylene), PET, PTFE (polytetrafluoroethylene) or PFA (soluble PTFE); the polyester is PEN (polyethylene terephthalate), PC (polycarbonate), PMMA (poly(methyl methacrylate)), PVAC (poly(viny acetate)) or PES (polyethersulfone resin).

And the material of the cutoff layer 212 can be a transparent oxide film, transparent fluoride film, silicon nitride family ($Si_xN_y$) or chalcogenide glasses. The transparent oxide film such as titanium dioxide ($TiO_2$), magnesium oxide (MgO), silicon dioxide ($SiO_2$), zirconium dioxide ($ZrO_2$), zinc oxide (ZnO) or aluminum oxide ($Al_2O_3$); the transparent fluoride film can be lithium fluoride (LiF), magnesium fluoride ($MgF_2$); the silicon nitride family ($Si_xN_y$) can be ($Si_3N_4$) or ($SiN_x$); the chalcogenide glasses can be glass of selenium (Se), tellurium (Te) or antimony (Sb). Certainly, the materials of the cutoff layer 212 can be zinc sulfide (ZnS), $SiO_xN_y$ or $SiO_xC_y$.

Referring still to FIG. 2, the first electrode layer 22 can be indium tin oxide (TiO), the second electrode layer 27 can be an alloy of magnesium and silver. In the bias voltage conditions, the electrons from the second electron layer 27 and the holes (so-called the electron hole) from the first electron layer 22 are recombined in the infrared organic light emitting layer 24, so that the infrared organic light emitting layer 24 emits infrared light, wherein the infrared light equipment (not-shown) can observe infrared light emitted from the infrared organic light emitting layer 24 through the transparent substrate 20, the first protective layer 21, the first protective layer 22 and the hole transport layer 23. Because the infrared organic light emitting layer 24 is a flat plane light source in the present invention, the organic display device can be used as a large area display device of infrared light.

Figure 4:
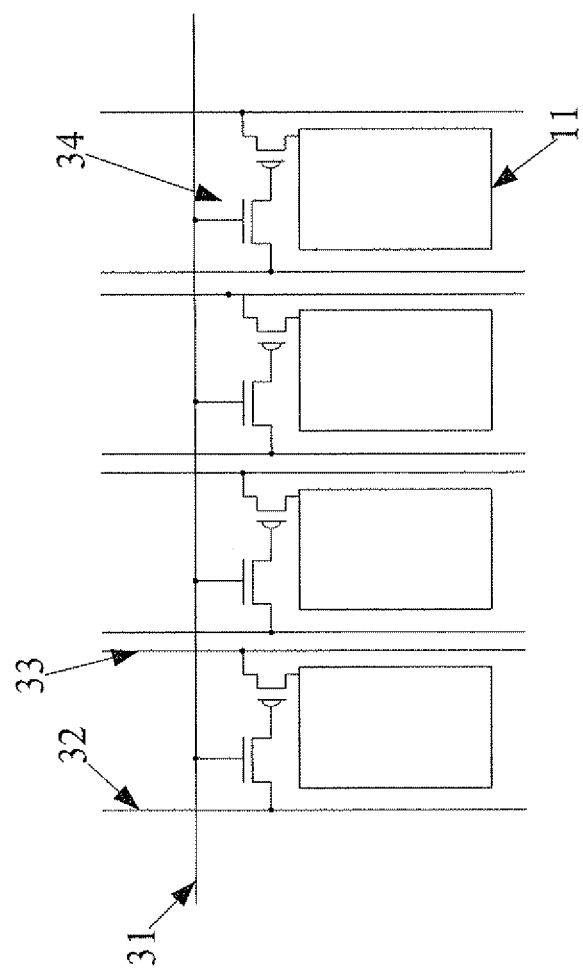
FIG. 4 is a schematic view of a control structure of the organic display device of the present invention.

Referring to FIG. 4, FIG. 4 represents the control structure schematic view of the organic display device in the present invention.

The transparent substrate (not show in FIG. 4) is formed with the scan lines 31, the data lines 32, the power lines 33 and the thin film transistors (TFT) 34. The scan line 31 and data line 32 are intersected to define a region to form the infrared display pixel 11, wherein the data line 32 and the power line 33 are dispose on both sides of the infrared display pixel 11. The infrared display pixel 11 in the present invention connects to the scan line 31, the data line 32 and the power line 33 through the TFT 34. The organic display device also comprises a driving module to drive the infrared display pixel 11 to emit the infrared light. For example, the driving module can be a gate driving chip and a source driving chip (not show in figure), which connect to the scan line 31 and the data line 32, respectively, to provide the scanning signal for scan line 31 and provide the data signal for data line 32, wherein the infrared display pixel 11 is switched on or off according to the signal from the scan line 31, the data line 32 and the power line 33.

In the present invention, the organic light emitting layer of the organic display device is filled with the infrared light emitting material as the infrared organic light emitting layer, and the flexible transparent substrate is used, so that the organic display device is able to carry out large area display of the infrared light, while production process can be simplified and manufacturing cost can be lowered; Because the present invention uses the transparent substrate, it is possible to manufacture the organic display device as a clothing and the like, which is thus easy to be used and carried, so that the function of the organic display device can be greatly expanded and the user's experience can be enhanced.

It is also clear that, although the present invention has been described with reference to some examples, a person of skill in the art shall be able to achieve equivalent forms, having the characteristics as set forth in the claims and hence all coming within the field of protection defined thereby.

What is claimed is:

1. An organic display device, comprising at least one infrared display pixel, wherein the infrared display pixel comprises a flexible transparent substrate which is deposited with a first electrode layer, an infrared organic light emitting layer and a second electrode layer thereon, and the infrared organic light emitting layer is filled with an infrared light emitting material;

wherein the infrared display pixel further comprises a first protective layer and a second protective layer, the first protective layer is formed between the transparent substrate and the first electrode layer, and the second protective layer having a closed bent shape is configured to form a protective space between the first protective layer and the second protective layer so that the infrared organic light emitting layer has at least one sidewall contacting with the second protective layer;

wherein the first protective layer comprises at least one polymer layer and at least one cutoff layer, and the polymer layer and the cutoff layer are alternately superimposed with each other;

wherein the transparent substrate is formed with scan lines, data lines, a power lines and switch array elements, the infrared display pixel connects to the scan line, the date line and the power line through the switch array element, and the infrared display pixel is switched on or off according to signals from the scan line, the date line and the power line, wherein the infrared light emitting material is a trivalent rare-earth ion complex having an infrared light emitting wavelength ranged from 0.76 micrometers to 400 micrometers.

2. The organic display device according to claim 1, wherein a hole transport layer is formed between the first electrode layer and the infrared organic light emitting layer, and an electron transport layer is formed on the second electrode layer.

3. The organic display device according to claim 2, wherein the infrared display pixel further comprises a hole blocking layer, and the hole transport layer, the hole blocking layer, and the electron transport layer are in the protective space.

4. An organic display device, comprising at least one infrared display pixel, wherein the infrared display pixel comprises a transparent substrate which is deposited with a first electrode layer, an infrared organic light emitting layer and a second electrode layer thereon, and the infrared organic light emitting is filled with an infrared light emitting material, wherein the infrared display pixel further comprises a first protective layer and a second protective layer, the first protective layer is formed between the transparent substrate and the first electrode layer, and the second protective layer having a closed bent shape is configured to form a protective space between the first protective layer and the second protective layer so that the infrared organic light emitting layer has at least one sidewall contacting the second protective layer;

wherein the first protective layer comprises at least one polymer layer and at least one cutoff layer, and the polymer layer and the cutoff layer are alternately superimposed with each other;

wherein the infrared light emitting material is a trivalent rare-earth ion complex having an infrared light emitting wavelength ranged from 0.76 micrometers to 400 micrometers.

5. The organic display device according to claim 4, wherein the transparent substrate is a flexible transparent substrate.

6. The organic display device according to claim 4, wherein a hole transport layer is formed between the first electrode layer and the infrared organic light emitting layer, and the electron transport layer is formed on the second electrode layer.

7. The organic display device according to claim 6, wherein the infrared display pixel comprises a hole blocking layer, and the hole transport layer, the hole blocking layer, and the electron transport layer are in the protective space.

* * * * *